United States Patent
Bovensiepen et al.

(10) Patent No.: US 6,426,380 B1
(45) Date of Patent: Jul. 30, 2002

(54) PROCESS FOR PRODUCING AN ABSORBER MATERIAL

(75) Inventors: Kurt Bovensiepen, Winnenden; Mathias Pieper, Besigheim; Detlef Spachmann, Backnang, all of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/555,653

(22) PCT Filed: Dec. 11, 1998

(86) PCT No.: PCT/DE98/03635

§ 371 (c)(1),
(2), (4) Date: Jul. 24, 2000

(87) PCT Pub. No.: WO99/32538

PCT Pub. Date: Jul. 1, 1999

(30) Foreign Application Priority Data

Dec. 19, 1997 (DE) .......................... 197 56 620

(51) Int. Cl.[7] .................................. C08K 3/08
(52) U.S. Cl. .................. 524/398; 528/31; 528/32; 525/479
(58) Field of Search .............. 524/398; 528/31, 528/32; 438/125, 127, 610; 525/479

(56) References Cited

U.S. PATENT DOCUMENTS

| 5,166,293 A | | 11/1992 | Tsutomu et al. |
| 5,332,795 A | * | 7/1994 | Fujuki et al. |
| 5,948,856 A | * | 9/1999 | Juen et al. |

FOREIGN PATENT DOCUMENTS

| DE | 2156939 | * | 5/1973 |
| DE | 38 27 487 | | 2/1989 |
| EP | 0 254 153 | | 1/1988 |
| EP | 0 380 267 | | 8/1990 |
| EP | 0 769 528 | | 4/1997 |

* cited by examiner

Primary Examiner—Robert Dawson
Assistant Examiner—Marc S. Zimmer
(74) Attorney, Agent, or Firm—Kenyon & Kenyon

(57) ABSTRACT

A method is described for producing an improved addition-crosslinked silicone rubber which is used as a damping material in hermetically sealed housings having a semiconductor.

14 Claims, No Drawings

PROCESS FOR PRODUCING AN ABSORBER MATERIAL

FIELD OF THE INVENTION

The present invention relates to a method of producing an absorber material, the absorber material produced according to this method and a semiconductor array in a hermetically sealed housing in which the absorber material according to the present invention is arranged.

DESCRIPTION OF RELATED ART

Open semiconductors are used in hermetically sealed housings, among other things. These housings contain, among other things, absorber material to absorb high frequencies occurring in the housing. Iron-filled silicone rubber is usually used as the absorber material.

The absorber material, i.e., the silicone rubber, is produced by addition crosslinking of a component A and a component B, where component A is a polydiorganosiloxane, in particular having the general formula —O—$SiR_1R_2CH=CH_2$ and component B is hydrogen siloxane, in particular having the general formula —O—$SiHCH_3R$ where R, $R_1$ and $R_2$ are the same or different hydrocarbon radicals and/or H. the polydiorganosiloxane has accessible groups for crosslinking reactions, in particular vinyl groups which may be on the chain ends or incorporated into the chain. The addition-crosslinked silicone rubber used as the absorber material, in particular having the general formula —O—$SiR_1R_2$—$CH_2$—$CH_2$—$SiRCH_3$—O— is produced by addition of SiH groups to the vinyl groups bound to silicon in a process catalyzed by noble metals or noble metal compounds, in particular palladium, for example. SiH groups are supplied in the form of component B, i.e., in particular hydrogen siloxane, which functions as a plasticizer in the cured silicone rubber, i.e., in the absorber material, in production of the addition-crosslinked silicone rubber.

This absorber material emits molecular hydrogen over a period of time, in particular at high temperatures or under the influence of moisture. This hydrogen can escape from an open housing. In hermetically sealed housings, however, the hydrogen reacts with the semiconductor, thus shortening the lifetime of the component.

Therefore, it is known that an irreversible hydrogen getter can be used in the hermetically sealed housing. The hydrogen released is captured by the getter material, so that less hydrogen reaches the semiconductor. The hydrogen getter also has silicon as a carrier, the actual getter material being an organic compound that irreversibly takes up hydrogen through use of the catalyst palladium. Because of the high price of the hydrogen getter, it is not used in Germany in particular.

Another possibility of preventing the wear on the semiconductor due to the formation of hydrogen as described above is to temper the absorber material. According to this method, the iron-filled absorber material is tempered for 48 hours at 200° C. before wear on the housing. Water and hydrogen are expelled from the absorber material, so that no hydrogen can evolve in the housing. However, one disadvantage is that this method is expensive and time consuming. Furthermore, the tempered absorber material must be stored under a protective gas and must not come into contact with atmospheric humidity. Finally, the mechanical properties of the absorber material are greatly impaired by tempering, and there are electric sealing problems in sealing the housing.

SUMMARY OF THE INVENTION

The present invention provides a method of producing an absorber material from a component A, in particular a polyorganosiloxane, preferably a polydiorganosiloxane, and a component B, in particular a hardener containing SiH, whereby in a first step of the method the SiH-containing hardener is added to the polyorganosiloxane in a reduced amount, and in a second step of the method a fully cured silicone rubber is obtained.

DETAILED DESCRIPTION OF THE INVENTION

In conjunction with the present invention, a SiH-containing hardener is understood to refer to a compound that can crosslink polyorganosiloxanes using its SiH groups.

In conjunction with the present invention, a reduced amount of hardener containing SiH is understood to be an amount of hardener according to which little or no excess, i.e., uncrosslinked, silicon hydride groups are present in the fully cured, addition-crosslinked silicone rubber. The present invention provides in particular for the absorber material to be produced in such a way that the fully cured silicone rubber contains very little or no excess silicon hydride groups. This can be accomplished according to the present invention by increasing the curing temperature and/or adding a reduced amount of component B in comparison with the amount traditionally used in production of the absorber material.

The quantities of hardener traditionally recommended by the manufacturers of absorber materials lead to an excess of hardener in the addition-crosslinked silicone rubber, so that excess, uncrosslinked silicon hydride groups are present and react with water to form unwanted molecular hydrogen. This process can be represented by the following formulas: —$[SiCH_3HO]_n$—+$nH_2O$→—$[SiCH_3(OH)O]_n$—+$nH_2$. The polymethylhydroxysiloxane formed in this reaction can also split off water by polycondensation with a vicinal molecule, thus sustaining the above-mentioned reaction, i.e., the release of hydrogen.

The quantities of hardener recommended by the manufacturers of these absorber materials may be reduced according to the present invention by approx. 40% to 50%. In particular, the present invention provides for the use of a ratio of polyorganosiloxane to SiH-containing hardener of 30:1 to 15:1, especially 26:1 to 18:1, in particular 90:35, 10:04, 9:04, 10:0.5 or 9:0.5 (amounts given in percent by weight).

The present invention has the advantage that hydrogen is no longer removed after being formed, but instead its formation is prevented from the beginning. The present invention has the advantage in particular that potential hydrogen emissions can be reduced by 95%, and no hydrogen can be detected at a sensitivity of 0.1 ppm when using absorber materials either with or without iron powder. Up to this temperature, it is certain that no hydrogen is released that could damage the semiconductors. The absorber material can be produced less expensively because of the small amount of hardener used, among other things. In addition, time is saved in production, especially with regard to the known tempering method. Finally, the mechanical requirements made of the absorber material produced according to the present invention, such as thermal stability, Shore A hardness, etc., are met in an advantageous manner.

In an especially preferred embodiment of the present invention, the above-mentioned method is carried out in such a way that a temperature of 140 to 180° C., preferably 150° C., is maintained over a period of 0.5 to 3 hours, preferably one hour, in the second step of the method, i.e., in the final curing. The curing temperature according to the present invention which is increased in comparison with the curing temperature of approx. 80° C. traditionally used leads to a further reduction in the formation of hydrogen.

The present invention also relates to a method of producing an absorber material from a component A, in particular a polyorganosiloxane such as polydiorganosiloxane, and a component B, in particular a hardener containing SiH, whereby in a first step of the method the SiH-containing hardener is added to the polyorganosiloxane, and then in a second step of the method, final curing is performed at a temperature of 140° C. to 180° C., preferably 150° C., over a period of 0.5 to 3 hours, preferably one hour, yielding a fully cured, addition-crosslinked silicone rubber. Thus, according to the present invention, it is possible to reduce hydrogen emissions by the measure of adding the hardener in a reduced amount and also by the measure of increasing the final curing temperature. A combination of both measures is of course also possible as described here. Both measures, either alone or in combination, lead to the production of an improved addition-crosslinked silicone rubber which is characterized in that it has essentially no free SiH groups.

The present invention also relates to the above-mentioned methods, whereby the addition-crosslinked silicone rubber is filled with iron powder. This is advantageous in particular because iron powder itself is a very good hydrogen getter.

According to an especially preferred embodiment of the present invention, hydrogen siloxane, preferably having the empirical formula $CH_3$—$[SiHCH_3O]_x$—$CH_3$ where $x \geq 1$, is used as the hardener.

The present invention of course also relates to an absorber material made of an addition-crosslinked silicone rubber with and without iron powder produced according to one of the methods mentioned above. The absorber material, i.e., the addition-crosslinked silicone rubber according to the present invention is characterized in that it contains essentially no free, i.e., uncrosslinked, SiH groups.

The present invention also relates to a semiconductor array including a semiconductor arranged in a hermetically sealed housing, with an absorber material according to the present invention being arranged in the housing as a damping material.

Additional advantageous embodiments of the present invention are derived from the subordinate claims.

The present invention is explained in greater detail on the basis of the following embodiments.

EXAMPLE 1

Determining the SiH Concentration

As described above, the silicon hydride group of the hardener is responsible for the unwanted hydrogen emission. More hydrogen can be formed when more free silicon hydride groups are present in the fully cured silicone rubber. One method of determining SiH concentration is based on FTIR. The SiH group has a definite peak at a wave number of 2160 $cm^{-1}$. The measured absorption is proportional to the SiH group concentration. The extinction, i.e., the peak height, represents the linear relationship between absorption and concentration.

Various batches with different but known mixing ratios and curing states were analyzed to determine the SiH group concentration. A uniform film of the sample to be analyzed was applied to a KBr pellet. The residual SiH content and the maximum possible hydrogen level can be determined from the decline in extinction.

Elastosil RT 601 or Sylgard 184 was used as the polydiorganosiloxane, i.e., as component A.

Sylgard 184 can be obtained from Dow Corning under item number 729790 and Elastosil RT 601 can be obtained from Wacker Chemie under item number 069025.

Hydrogen siloxane with the empirical formula $CH_3$—$[SiHCH_3O]_x$—$CH_3$ was used as the hardener, i.e., component B.

The traditionally used ratio of 9 parts Elastosil RT 601 to one part hardener or 10 parts Sylgard 184 to one part hardener was used as the control experiment (cf. last column in Table 1 "Manufacturer's recommendation") (all ratios given below are in wt% to wt%). To check the detection sensitivity, a ratio of 9 parts Elastosil RT 601 to 0.026 parts hardener or 10 parts Sylgard 184 to 0.0146 parts hardener was used.

The ratios used according to the present invention were 9:0.5, 9:0.4 and 9:0.35 parts Elastosil RT 601 to hardener, i.e., component A and component B were mixed together in the stated ratios and then fully cured for one hour at either 80° C. or 150° C.

For each of the above-mentioned mixtures, the following conditions were analyzed: uncured, fully cured after one hour at 80° C. and fully cured after one hour at 150° C. The results are summarized in Table 1 below.

| Sample No. | Polydiorganosiloxane | Mixing ratio A:B | Full curing | Extinction | Residual hardener content of initial weight | Free hardener content* | Residual hardener content** |
|---|---|---|---|---|---|---|---|
| a | RT 601 | 9:0.026 | uncured | 0.0027 | 100% | 0.29% | 1.0% |
| b | RT 601 | 9:0.026 | cured | 0 | 0% | 0% | 0.0% |
| 1. | RT 601 | 9:0.35 | uncured | 0.0851 | 100% | 3.74% | 30.8% |
| 2. | RT 601 | 9:0.35 | 1 h, 80° C. | — | — | — | — |
| 3. | RT 601 | 9:0.35 | 1 h, 150° C. | 0.007 | 8% | 0.31% | 2.5% |
| 4. | RT 601 | 9:0.4 | uncured | 0.101 | 100% | 4.26% | 36.6% |
| 5. | RT 601 | 9:0.4 | 1 h, 80° C. | 0.031 | 31% | 1.31% | 11.2% |
| 6. | RT 601 | 9:0.4 | 1 h, 150° C. | 0.013 | 13% | 0.55% | 4.7% |
| 7. | RT 601 | 9:0.5 | uncured | 0.12 | 100% | 5.26% | 43.5% |
| 8. | RT 601 | 9:0.5 | 1 h, 80° C. | 0.039 | 33% | 1.71% | 14.1% |
| 9. | RT 601 | 9:0.5 | 1 h, 150° C. | 0.0196 | 16% | 0.86% | 7.1% |
| 10. | RT 601 | 9:0.5 | 24 h, 200° C. | 0 | 0% | 0% | 0.0% |

-continued

| Sample No. | Polydi-organo-siloxane | Mixing ratio A:B | Full curing | Extinction | Residual hardener content of initial weight | Free hardener content* | Residual hardener content** |
|---|---|---|---|---|---|---|---|
| 11. | RT 601 | 9:1 | uncured | 0.276 | 100% | 10% | 100.0% |
| 12. | RT 601 | 9:1 | 1 h, 80° C. | 0.167 | 61% | 6.05% | 60.5% |
| 13. | RT 601 | 9:1 | 24 h, 200° C. | 0.002 | 1% | 0.07% | 0.7% |
| c | Sylgard 184 | 10:0.0146 | uncured | 0.0024 | 100% | 0.15% | 1.6% |
| d | Sylgard 184 | 10:0.0146 | fully cured | 0 | 0% | 0% | 0.0% |
| 14. | Sylgard 184 | 10:1 | uncured | 0.154 | 100% | 9.09% | 100.0% |
| 15. | Sylgard 184 | 10:1 | 1 h, 80° C. | 0.0749 | 49% | 4.42% | 48.6% |
| 16. | Sylgard 184 | 10:1 | 1 h, 200° C. | 0.0575 | 37% | 3.39% | 37.3% |
| 17. | Sylgard 184 | 10:1 | 2 h, 200° C. | 0.0528 | 34% | 3.12% | 34.3% |
| 18. | Sylgard 184 | 10:1 | 24 h, 200° C. | 0.0188 | 12% | 1.11% | 12.2% |

Table 1: Residual hardener content as a function of curing and mixing ratio (*Free hardener content of the mixture before and after curing; **Based on addition of hardener according to the manufacturer's recommendation)

It can be seen from Table 1 that the free hardener content is much lower with the mixing ratios according to the present invention than with the conventional mixing ratios. This table also shows that a further reduction in free hardener content is achieved by increasing the curing temperature from 80° C. to 150° C. Therefore, the mixing ratios according to the present invention using only approx. 40–50% of the amount of hardener conventionally used, based on a certain amount of component A, and/or the increased curing temperature according to the present invention lead to a greatly reduced free hardener content in the addition-crosslinked silicone rubber, so that evolution of hydrogen is greatly reduced.

EXAMPLE 2

Determining Hydrogen Gas Evolution

An H analyzer from Leybold Heraeus having a sensitivity of 0.1 ppm was used to determine hydrogen gas evolution. With this analyzer, the hydrogen content is determined on the basis of the change in thermal conductivity of a sensor. Hydrogen gas evolution was determined at test temperatures of 90° C. and 220° C., because it is known that iron releases dissolved hydrogen only at temperatures above 180° C. The usual measurement time was three minutes. This was automatically prolonged if there was a measurement signal. For preparation of the sample, the iron-containing absorber materials were ground in a mortar immediately before performing the measurement. Unfilled absorber materials were cut into small pieces.

The following mixing ratios were investigated:

A) Elastosil RT601 filled with 82% iron powder:

Mixing ratio 9:0.35 and 9:0.5 (component A:B) and the traditional mixing ratio of 9:1 as the control.

Elastosil RT 601 unfilled: 9:0.35 and 9:0.5

Samples were cured for one hour at 80° C. or for one hour at 150° C.

B) Sylgard 184 filled with 82% iron powder:

Mixing ratio 10:1 (component A:B) at a curing temperature of 80° C. for one hour as the control and at a mixing ratio of 10:1 at a curing temperature of 150° C. for one hour.

Sylgard 184 without iron powder: mixing ratio 10:1

First the maximum possible hydrogen content was determined on the basis of the molecular weight of the hardener containing SiH using the empirical formula $CH_3$—$[SiHCH_3O]_x$—$CH_3$. If x is a large number, the two terminal methyl groups can be disregarded.

The molecular weight of the individual elements can be seen from Table 2 below.

TABLE 2

Breakdown of molecular weight

| Element | Number | Atomic weight | Mol. wt. in g |
|---|---|---|---|
| Si | 1 | 28 | 28 |
| C | 1 | 12 | 12 |
| O | 1 | 16 | 16 |
| H | 4 | 1 | 4 |
| Total | | | 60 |

Since only the hydrogen atom bound to the silicon atom can be split off, only two grams of hydrogen can be formed per 60 grams of hardener, one gram of this hydrogen coming from the hardener and one gram from the moisture.

Table 3 below shows the maximum amount of hydrogen that can be split off from the absorber material.

TABLE 3

Calculated maximum hydrogen content (lines H through K take into account the hydrogen content from the reaction with atmospheric humidity)

| | | | Mixing ratio (A:B) | | | |
|---|---|---|---|---|---|---|
| Line | | | 9:1 | 9:0.5 | 9:0.4 | 9:0.35 |
| A | Resin content in g | Calculation | 9 | 9 | 9 | 9 |
| B | Hardener content in g | | 1 | 0.5 | 0.4 | 0.35 |

TABLE 3-continued

Calculated maximum hydrogen content (lines H through K take into account the hydrogen content from the reaction with atmospheric humidity)

| Line | | | 9:1 | 9:0.5 | 9:0.4 | 9:0.35 |
|---|---|---|---|---|---|---|
| | | | Mixing ratio (A:B) | | | |
| C | Damping material in g | | 22 | 22 | 22 | 22 |
| D | Silicone content | | 18% | 18% | 18% | 18% |
| E | Silicone weight in g | C*D | 3.96 | 3.96 | 3.96 | 3.96 |
| F | Hardener content | B/(A + B) | 10.0% | 5.3% | 4.3% | 3.7% |
| G | Hardener weight in g | E*F | 0.40 | 0.21 | 0.17 | 0.15 |
| H | H weight in mg | 2*1000* G/60 | 13.2 | 6.9 | 5.6 | 4.9 |
| I | H content in ppm uncured (unfilled) | H/C*10⁶ | 600 [3333] | 316 [1756] | 255 [1417] | 225 [1250] |
| J | H content in ppm, cured 1 h, 80° C. (unfilled) | I* residual hardener content from Table 1 | 366 [2033] | 104.0 [578] | 79.0 [439] | — |
| K | H content in ppm, cured 1 h, 150° C. (unfilled) | I* residual hardener content from Table 1 | — | 50.5 [281] | 33.2 [184] | 18.0 [100] |

It can be seen from Table 3 that the cleavable hydrogen content is considerably lower at the mixing ratios according to the present invention. This table also shows that this amount is decreased further by increasing the curing temperature.

The measured values for hydrogen gas evolution as a function of the mixing ratio and the curing temperature can be seen in Table 4 below.

No hydrogen gas evolution could be detected at a test temperature of 90° C. Hydrogen is split off only at higher temperatures. With an increase in hardener content, there is also an increase in the formation of hydrogen. The amount of hydrogen split off can be reduced significantly by increasing the curing temperature as recommended according to the present invention. This also applies to the addition of hardener in a reduced amount in relation to the polydiorganosiloxane component as recommended according to the present invention in comparison with the conventional ratio of these two components. The difference between the measured values in Table 4 and the calculated values in Table 3 is obtained from the time dependence of the reaction.

EXAMPLE 3

Determining the Hardness

In this example, the hardness (Shore A) was determined according to DIN 53505.

Table 5 below shows the Shore hardness as a function of the mixing ratio and the curing temperature.

TABLE 5

Shore A hardness as a function of mixing ratio and curing temperature

| No. | Poly-diorgano-siloxane | Mixing ratio | Amount of iron in g | Curing | Shore A hardness |
|---|---|---|---|---|---|
| 1. | RT601 | 9:0.35 | 0 | 1 h, 80° C. | 13 |
| 2. | RT601 | 9:0.35 | 0 | 1 h, 150° C. | 20–22 |
| 3. | RT601 | 9:0.35 | 43 | 1 h, 80° C. | 50 |
| 4. | RT601 | 9:0.35 | 43 | 1 h, 150° C. | 57 |
| 5. | RT601 | 9:0.5 | 0 | 1 h, 80° C. | 35 |
| 6. | RT601 | 9:0.5 | 0 | 1 h, 150° C. | 42 |

| | | | | | H₂ gas evolution | | | |
|---|---|---|---|---|---|---|---|---|
| | | | | | Test temp. 90° C. | | Test temp. 220° C. | |
| No. | Poly-diorgano-siloxane | Mixing ratio | Amount of iron in g | Curing | Initial wt in g | Gas evolution ppm | Initial wt in g | Gas evolution ppm |
| 1. | RT601 | 9:0.35 | 0 | 1 h, 80° C. | 1.47 | 0 | — | — |
| 2. | RT601 | 9:0.35 | 43 | 1 h, 80° C. | — | — | 2.01 | 1.2 |
| 3. | RT601 | 9:0.35 | 43 | 1 h, 150° C. | — | — | 2.33 | 0.5 |
| 4. | RT601 | 9:0.5 | 0 | 1 h, 80° C. | — | — | 0.306 | 12 |
| 5. | RT601 | 9:0.5 | 0 | 1 h, 150° C. | — | — | 0.3 | 0.5 |
| 6. | RT601 | 9:0.5 | 43 | 1 h, 80° C. | — | — | 1.35 | 3.5 |
| 7. | RT601 | 9:0.5 | 43 | 1 h, 150° C. | — | — | 1.37 | 1.5 |
| 8. | RT601 | 9:1 | 0 | 1 h, 80° C. | 1.27 | 0 | 0.33 | 350 |
| 9. | RT601 | 9:1 | 0 | 1 h, 150° C. | — | — | 0.33 | 70 |
| 10. | RT601 | 9:1 | 46 | 1 h, 80° C. | 2.5 | 0 | 2.74 | 15.4 |
| 11. | RT601 | 9:1 | 46 | 1 h, 150° C. | — | — | 1.7 | 2 |
| 12. | Sylgard 184 | 10:1 | 0 | 1 h, 80° C. | — | — | 0.4 | 230 |
| 13. | Sylgard 184 | 10:1 | 50 | 1 h, 80° C. | 1.3 | 0 | 1.62 | 31 |
| 14. | Sylgard 184 | 10:1 | 50 | 1 h, 150° C. | — | — | 1.86 | 30 |

Table 4: Measured gas evolution values as a function of mixing ratio and curing temperature

TABLE 5-continued

Shore A hardness as a function of mixing ratio and curing temperature

| No. | Polydiorganosiloxane | Mixing ratio | Amount of iron in g | Curing | Shore A hardness |
|---|---|---|---|---|---|
| 7.  | RT601      | 9:0.5  | 43 | 1 h, 80° C.  | 74–76 |
| 8.  | RT601      | 9:0.5  | 43 | 1 h, 150° C. | 79–81 |
| 9.  | RT601      | 9:1    | 0  | 1 h, 80° C.  | 50    |
| 10. | RT601      | 9:1    | 0  | 1 h, 150° C. | 52    |
| 11. | RT601      | 9:1    | 46 | 1 h, 80° C.  | 83–85 |
| 12. | RT601      | 9:1    | 46 | 1 h, 150° C. | 86–87 |
| 13. | Sylgard 184 | 10:1   | 0  | 1 h, 80° C.  | 51–52 |
| 14. | Sylgard 184 | 10:1   | 0  | 1 h, 150° C. | 68    |
| 15. | Sylgard 184 | 10:1   | 50 | 1 h, 80° C.  | 86    |
| 16. | Sylgard 184 | 10:1   | 50 | 1 h, 150° C. | 88–89 |
| 17. | Sylgard 184 | 10:0.5 | 0  | 1 h, 80° C.  | 25    |
| 18. | Sylgard 184 | 10:0.5 | 0  | 1 h, 150° C. | 32–34 |

With an increase in hardener content and curing temperature, the Shore A hardness increases due to a greater degree of crosslinking. Thus, there is also a change in the mechanical properties, such as the elongation at tear and tear propagation resistance. However, these properties are compensated to a great extent by the filler content. It has been found that the mixing ratios provided according to the present invention, like the higher curing temperature recommended according to the present invention, do not have a significant negative effect on hardness but instead actually improve it to some extent.

EXAMPLE 4

Determining the Thermal Stability

In this example, the thermal stability of the absorber materials according to the present invention without iron filling was analyzed by determining the thermal stability on the basis of weight loss. A sample was heated from room temperature to 850° C. at a rate of 20 K/min in a thermobalance where the weight loss was determined continuously. Air was used as the purging gas. The type of curing here has no effect on the thermal stability of the absorber material.

Table 6 shows the thermal stability of the absorber materials according to the present invention as a function of the mixing ratio and the curing temperature.

TABLE 6

Thermal stability as a function of mixing ratio and curing temperature

| No. | Polydiorganosiloxane | Mixing ratio (A:B) | Curing | Start of weight loss in ° C. |
|---|---|---|---|---|
| 1.  | RT601      | 9:0.35 | 1 h, 80° C.  | 196 |
| 2.  | RT601      | 9:0.35 | 1 h, 150° C. | 216 |
| 3.  | RT601      | 9:0.5  | 1 h, 80° C.  | 220 |
| 4.  | RT601      | 9:0.5  | 1 h, 150° C. | 220 |
| 5.  | RT601      | 9:1    | 1 h, 80° C.  | 208 |
| 6.  | RT601      | 9:1    | 1 h, 150° C. | 212 |
| 7.  | Sylgard 184 | 10:0.5 | 1 h, 80° C.  | 216 |
| 8.  | Sylgard 184 | 10:0.5 | 1 h, 150° C. | 220 |
| 9.  | Sylgard 184 | 10:1   | 1 h, 80° C.  | 208 |
| 10. | Sylgard 184 | 10:1   | 1 h, 150° C. | 228 |

Low molecular components begin to produce gas at temperatures below 200° C. when very low and very high hardener amounts are used. At high curing temperatures, these components are expelled during curing. The low molecular content is very low when using Elastosil RT 608 in a mixing ratio of 9:0.5 and Sylgard 184 in a mixing ratio of 10:0.5. The thermal stability of the absorber materials according to the present invention is comparable to or even better than that of traditional absorber materials.

EXAMPLE 5

Determining the Material Shrinkage

To determine the shrinkage of the material, a mixing ratio of 9 parts Elastosil RT 601 to 0.4 parts hydrogen siloxane was used. The silicone rubber had an iron content of 82%. Samples were cured for one hour at 150° C. The aluminum frame of the mold used to determine the material shrinkage had dimensions of 100 mm×10 mm×5 mm.

To determine the free shrinkage, the frame was clamped on a chromatized aluminum sheet, filled with absorber material and then cured. The material did not adhere to the frame or the sheet. Shrinkage of the material is calculated from the difference between the dimensions of the mold and the dimensions of the part. To determine hindered shrinkage, the aluminum sheet was also primed with a primer G790. The absorber material would then adhere to the aluminum sheet.

The results of these experiments are shown in Table 7.

TABLE 7

| | Material shrinkage | |
|---|---|---|
| Description | Free shrinkage | Hindered shrinkage |
| Dimension of mold | 100.0 mm | 100.0 mm |
| Dimension of part | 98.15 mm | 99.78 [mm] |
| Difference | 1.85 mm | 0.22 [mm] |
| Shrinkage | 1.85% | 0.22% |

Shrinkage was reduced when the absorber material was cast on a surface to which it adhered because of the use of an adhesion promoter. For this reason, the carrier plates must have sufficient rigidity to be able to absorb the resulting shrinkage stresses. The higher the curing temperature, the greater is also the shrinkage.

What is claimed is:

1. A method of producing an addition-crosslinked silicone rubber absorber material from a polyorganosiloxane and a hardener containing silicon hydride groups, comprising the steps of: adding a hardener to a polyorganosiloxane in a reduced amount, and yielding a fully cured, addition-crosslinked silicone rubber, whereby the addition-crosslinked silicone rubber has essentially no free silicon hydride groups and the absorber material can essentially emit no hydrogen, wherein the hardener containing silicon hydride groups is hydrogen siloxane, having the empirical formula $CH_3-[SiHCH_3O]_x-CH_3$.

2. The method according to claim 1, wherein the step of yielding is carried out at a temperature of 140° C. to 180° C. for a period of 0.5 to 3 hours.

3. The method according to claim 2, wherein the step of yielding is carried out at a temperature of 150° C. for a period of one hour.

4. The method according to claim 1, wherein iron powder is added to the polyorganosiloxane.

5. The method according to claim 2, wherein iron powder is added to the polyorganosiloxane.

6. A method of producing an addition-crosslinked silicone rubber absorber material from a polyorganosiloxane and a hardener containing silicon hydride groups, comprising the steps of adding a hardener to a polyorganosiloxane, and curing the material at a temperature of 140° C. to 180° C. for a period of 0.5 to 3 hours so as to yield a fully cured, addition-crosslinked silicone rubber, wherein the addition-crosslinked silicone rubber has essentially no free silicon hydride groups and the absorber material can essentially emit no hydrogen, wherein the hardener containing silicon hydride groups is hydrogen siloxane, having the empirical formula $CH_3-[SiHCH_3O]_x-CH_3$.

7. The method according to claim 6, wherein the step of curing is carried out at a temperature of 150° C. for a period of one hour.

8. The method according to claim 6, wherein the weight ratio of polyorganosiloxane to hardener containing silicon hydride groups is 30:1 to 15:1.

9. The method according to claim 6, wherein the weight ratio of polyorganosiloxane to hardener containing silicon hydride groups is 30:1 to 15:1.

10. The method according to claim 6, wherein the weight ratio of polyorganosiloxane to hardener containing silicon hydride groups is 26:1 to 18:1.

11. The method according to claim 6, wherein the weight ratio of polyorganosiloxane to hardener containing silicon hydride groups is 26:1 to 18:1.

12. The method according to claim 6, wherein iron powder is added to the absorber material.

13. The method according to claim 6, wherein iron powder is added to the absorber material.

14. The method according to claim 8, wherein iron powder is added to the absorber material.

* * * * *